(12) United States Patent
Ortiz

(10) Patent No.: US 11,757,541 B2
(45) Date of Patent: Sep. 12, 2023

(54) RADIO FREQUENCY POWER DETECTOR

(71) Applicant: Qorvo US, Inc., Greensboro, NC (US)

(72) Inventor: Jeffery Peter Ortiz, Chandler, AZ (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 17/161,137

(22) Filed: Jan. 28, 2021

(65) Prior Publication Data

US 2021/0250106 A1 Aug. 12, 2021

Related U.S. Application Data

(60) Provisional application No. 62/975,037, filed on Feb. 11, 2020, provisional application No. 62/972,874, filed on Feb. 11, 2020.

(51) Int. Cl.
*G05F 3/26* (2006.01)
*H04B 17/10* (2015.01)

(52) U.S. Cl.
CPC .......... *H04B 17/102* (2015.01); *G05F 3/262* (2013.01)

(58) Field of Classification Search
None
See application file for complete search history.

(56) References Cited

U.S. PATENT DOCUMENTS

| | | | | |
|---|---|---|---|---|
| 6,130,579 | A * | 10/2000 | Iyer | H03F 1/0261 330/133 |
| 6,266,015 | B1 * | 7/2001 | Heckaman | H01Q 19/062 343/700 MS |
| 6,462,527 | B1 * | 10/2002 | Maneatis | G05F 3/262 323/313 |
| 7,567,123 | B2 * | 7/2009 | Leung | H03F 3/4508 330/136 |
| 7,656,229 | B2 * | 2/2010 | Deng | H03F 1/3205 330/149 |
| 7,839,210 | B2 * | 11/2010 | Bas | H03D 1/00 329/347 |
| 8,005,445 | B2 * | 8/2011 | Kuriyama | H03G 3/3047 455/127.3 |
| 8,319,557 | B2 * | 11/2012 | Prikhodko | H03F 3/195 330/295 |
| 8,385,860 | B2 * | 2/2013 | Teraguchi | G01R 21/10 455/127.1 |
| 9,500,681 | B2 * | 11/2016 | Boucey | G01R 35/005 |
| 9,507,358 | B2 * | 11/2016 | David | H03F 1/30 |
| 9,866,259 | B1 * | 1/2018 | Margomenos | H04B 7/0413 |
| 10,164,593 | B1 * | 12/2018 | Harwalkar | H03G 3/20 |
| 10,958,223 | B2 * | 3/2021 | Hagiwara | H03F 1/301 |
| 2007/0030064 | A1 * | 2/2007 | Yu | G01R 21/10 330/140 |

(Continued)

*Primary Examiner* — Thomas J. Hiltunen
(74) *Attorney, Agent, or Firm* — Withrow & Terranova, P.L.L.C.

(57) ABSTRACT

A radio frequency (RF) power detector is disclosed. The RF power detector includes an envelope detector having an RF signal terminal and a current mode terminal, wherein the envelope detector is configured to detect peak voltages of an RF signal at the RF signal terminal. Further included is a detector current mirror having a first mirror branch coupled to the current mode terminal and a second mirror branch configured to create a detector current that is proportional to a branch current through the first mirror branch in response to peak voltages detected by the envelope detector.

18 Claims, 8 Drawing Sheets

(56) References Cited

U.S. PATENT DOCUMENTS

2010/0330938 A1* 12/2010 Yin .......................... H03F 3/24
330/257
2021/0003613 A1* 1/2021 Fuhrmann .............. G01R 15/09

* cited by examiner

RADIO FREQUENCY POWER DETECTOR

RELATED APPLICATIONS

This application claims the benefit of provisional patent application Ser. No. 62/972,874, filed Feb. 11, 2020, and of provisional patent application Ser. No. 62/975,037, filed Feb. 11, 2020, the disclosures of which are hereby incorporated herein by reference in their entireties.

FIELD OF THE DISCLOSURE

The present disclosure relates to radio frequency power detectors employed in radio frequency communication circuitry.

BACKGROUND

Radio frequency (RF) power detectors are commonly used in cellular mobile telephones. RF power detectors are typically used to provide a detector voltage that is proportional to the forward power at the output of an RF transmitter. The detector voltage is then sampled by an analog-to-digital converter into a digital sample that is then used to adjust the gain of the RF transmitter to achieve a desired output power.

Adding millimeter-wave transmitters to a mobile phone creates a new set of challenges for RF power detection. A fifth generation (5G) mobile phone may need to employ multiple antennas and multiple lineups of the millimeter-wave transmitters that form an array to beam steer a transmit signal towards a base station. This need presents a difficult issue in that there are limited practical ways, if any, to measure the conducted transmitted power at the multiple antennas. Thus, there remains a critical need for an accurate RF detector for millimeter-wave transmitters coupled to multiple antennas.

SUMMARY

A radio frequency (RF) power detector is disclosed. The RF power detector includes an envelope detector having an RF signal terminal and a current mode terminal, wherein the envelope detector is configured to detect peak voltages of an RF signal at the RF signal terminal. Further included is a detector current mirror having a first mirror branch coupled to the current mode terminal and a second mirror branch configured to create a detector current that is proportional to a branch current through the first mirror branch in response to peak voltages detected by the envelope detector.

Also disclosed is an RF power detector combiner having a plurality of RF power detectors configured to generate a detector voltage from a total detector current flowing from the plurality of RF power detectors. A detector current scaler is also disclosed for easing analog-to-digital dynamic range requirements.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
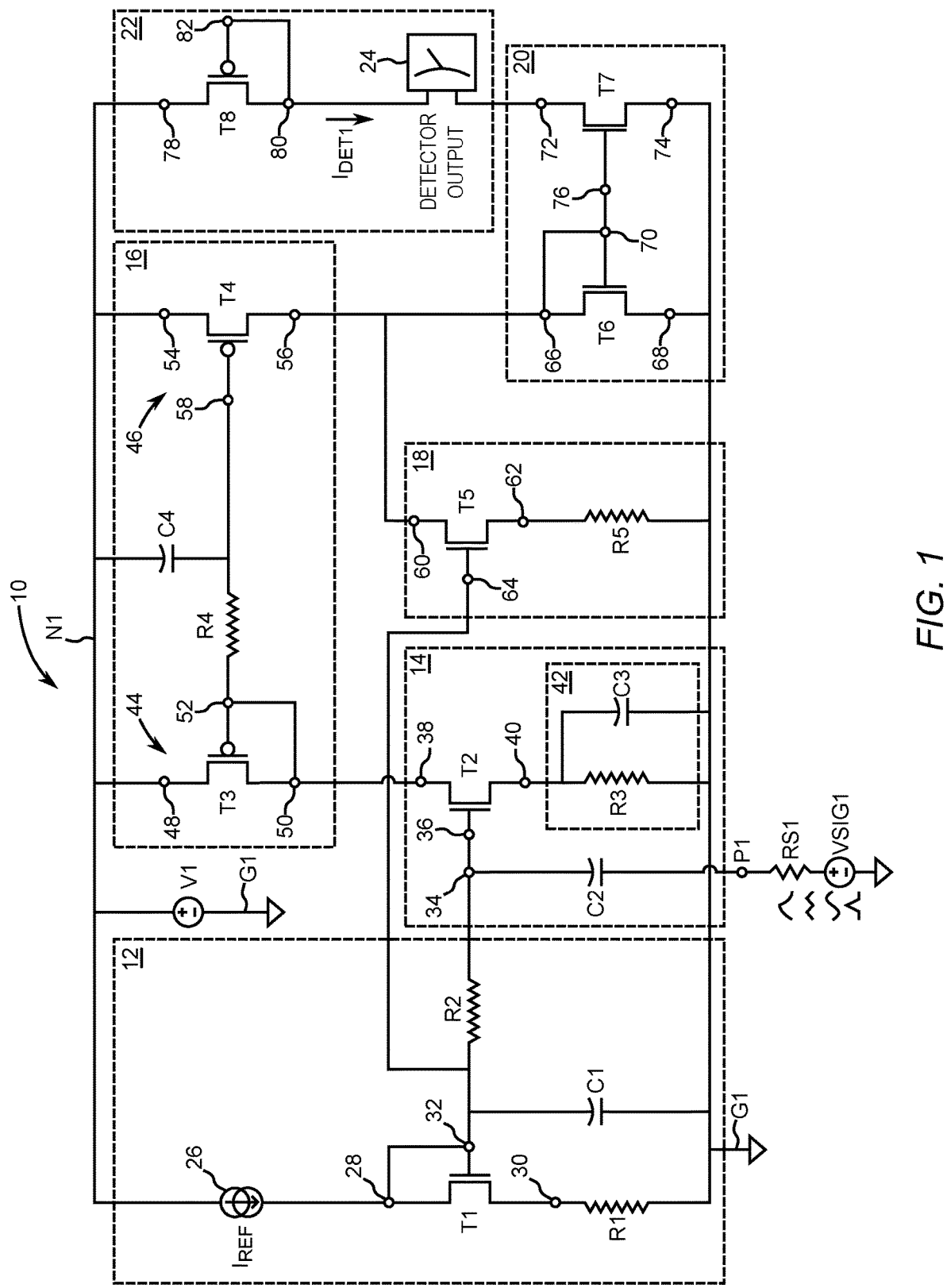
FIG. 1 is a schematic of a first embodiment of a radio frequency (RF) power detector that is structured in accordance with the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

As mentioned in the background above, there are limited practical ways, if any, to measure the conducted transmitted power from multiple antennas in a mobile phone antenna array. For at least these reasons it is desirable to create a current rather than a voltage that is proportional to the forward power. Once in the current domain it is relatively facile to combine the detector outputs into a single detected signal that is proportional to the entire RF output power of the antenna array.

FIG. 1 is a schematic of a first embodiment of a radio frequency (RF) power detector 10 of a current mode type that is structured in accordance with the present disclosure. The RF power detector 10 includes reference circuitry 12, an envelope detector 14, a detector current mirror 16, an offset current subtraction branch 18, an output current mirror 20, and an output branch 22. A detector output 24 in the output branch 22 is symbolically represented by an ampere-meter.

The reference circuitry 12 includes a first transistor T1 having a first current terminal 28, a second current terminal 30, and a first control terminal 32. The current terminal 28 is coupled to the first control terminal 32. A reference current source 26 that is configured to provide a reference current $I_{REF}$ is coupled between a supply node N1 and the first current terminal 28 of the first transistor T1. A first resistor R1 is coupled between the second current terminal 30 of the first transistor T1 and a fixed voltage node such as ground G1. A supply voltage source V1 coupled between the supply node N1 and ground G1 supplies the reference circuitry 12 and the remainder of the power detector 10 with energy to operate. The supply voltage source V1 may be a battery. In this exemplary embodiment, the first transistor T1 is of the negative metal oxide semiconductor (NMOS) type.

A first capacitor C1 coupled between the first control terminal 32 and ground G1 is configured to filter the reference current $I_{REF}$. A second resistor R2 provides additional filtering of the reference current $I_{REF}$. The second resistor R2 is coupled between the first control terminal 32 and an RF signal terminal 34 included in the envelope detector 14.

In further regard to the envelope detector 14, a second capacitor C2 is coupled between the RF signal terminal 34 and an RF port P1, wherein the second capacitor C2 functions as a coupling capacitor to convey an RF signal from an RF signal source VSIG1 to the RF signal terminal 34. The RF signal source VSIG1 is external to the envelope detector 14 and is coupled to the RF port P1 through a source impedance RS1. Various types of RF signals generated by the RF signal source VSIG1 are symbolically depicted adjacent to the RF signal source VSIG1.

The envelope detector 14 further includes a second transistor T2 having a second control terminal 36 coupled to the RF signal terminal 34, a third current terminal 38 that serves as a current mode terminal for the envelope detector 14 and a fourth current terminal 40. In this exemplary embodiment, the second transistor T2 is of the NMOS type.

A low-pass filter 42 is coupled between the fourth current terminal 40 and ground G1. In this exemplary embodiment, the low-pass filter 42 is a parallel combination of a third resistor R3 and a third capacitor C3. However, it is to be understood that the low-pass filter 42 may include additional passive and active components to provide enhanced filtering.

The detector current mirror 16 has a first mirror branch 44 and a second mirror branch 46. The first mirror branch 44 includes a third transistor T3 having a fifth current terminal 48 coupled to the supply node N1 and a sixth current terminal 50 that is coupled to the third current terminal 38. The third transistor T3 has a third control terminal 52 that is coupled to the sixth current terminal 50. The second mirror branch 46 includes a fourth transistor T4 having a seventh current terminal 54 coupled to the supply node N1 and an eighth current terminal 56.

A fourth control terminal 58 is coupled to the third control terminal 52 through a fourth resistor R4. A fourth capacitor C4 is coupled between the fourth control terminal 58 and the supply node N1. The fourth capacitor C4 and the fourth resistor R4 provide additional filtering to remove RF components that may affect performance of the detector current mirror 16. In this exemplary embodiment, the third transistor T3 and the fourth transistor T4 are of the positive metal oxide semiconductor (PMOS) type.

The offset subtraction branch 18 includes a fifth transistor T5 and a fifth resistor R5. The fifth transistor T5 has a ninth current terminal 60 coupled to the eighth current terminal 56 of the fourth transistor T4. The fifth resistor R5 is coupled between a tenth current terminal 62 of the fifth transistor T5 and ground G1. The fifth transistor T5 also has a fifth control terminal 64 that is coupled to the first control terminal 32 of the first transistor T1. In this exemplary embodiment, the fifth transistor T5 is of the NMOS type.

The output current mirror 20 has a sixth transistor T6 with an eleventh current terminal 66 coupled to both the eighth terminal 56 of the fourth transistor T4 and the ninth terminal 60 of the fifth transistor T5. The sixth transistor T6 has a twelfth current terminal 68 that is coupled to ground G1 and a sixth control terminal 70 that is coupled to the eleventh current terminal 66. The output current mirror 20 has a seventh transistor T7 having a thirteenth current terminal 72 that is coupled to the detector output 24. The seventh transistor T7 has a fourteenth current terminal 74 that is coupled to ground G1 and a seventh control terminal 76 coupled to the sixth control terminal 70 of the sixth transistor T6. In this exemplary embodiment, the sixth transistor T6 and the seventh transistor T7 are of the NMOS type.

The output branch 22 includes an eighth transistor T8 having a fifteenth current terminal 78 coupled to the supply node N1 and a sixteenth current terminal 80 coupled to the detector output 24. The eighth transistor T8 has an eighth control terminal 82 coupled to the sixteenth current terminal 80. In this exemplary embodiment, the eighth transistor T8 is of the PMOS type.

During operation of the first embodiment the second transistor T2 functions as a rectifier diode that detects peak voltage of an RF envelope of the RF signal entering a first port PORT1. The third resistor R3 and the third capacitor C3 construct a low-pass filter network that is configured to substantially remove the RF components of the RF signal leaving a direct current (DC) voltage that is proportional to the RF power of the RF signal at the first port PORT1. The DC voltage creates a DC current that flows into the detector current mirror 16 formed by the third transistor T3 and the fourth transistor T4. RF filtering of the DC current is provided by the fourth resistor R4 and the fourth capacitor C4.

Regarding the offset current subtraction branch 18, the fifth transistor T5 is configured to remove a DC offset current flowing through the second transistor T2. A resultant detected current $I_{DET1}$ flows through the output branch 22 of the seventh transistor T7. The DC offset current flowing through the second transistor T2 is provided to keep the second transistor T2 biased near threshold when little or no RF power is applied. Biasing the second transistor T2 near threshold ensures the RF power detector 10 has a more well-behaved transfer function versus process and temperature variation.

There is a slight residual offset current (~1 µA) at lower power levels. This slight residual offset current is due to a channel length modulation effect in the transistors T1 through T8. Cascoding of all or some of the transistors T1 through T8 may be employed to reduce the slight residual offset current. Alternatively, the slight residual offset current may be calibrated out by measuring the DC current with no RF power present. However, it is to be understood that this envisioned reduction in the slight residual offset current is not necessary in all embodiments.

Figure 2:
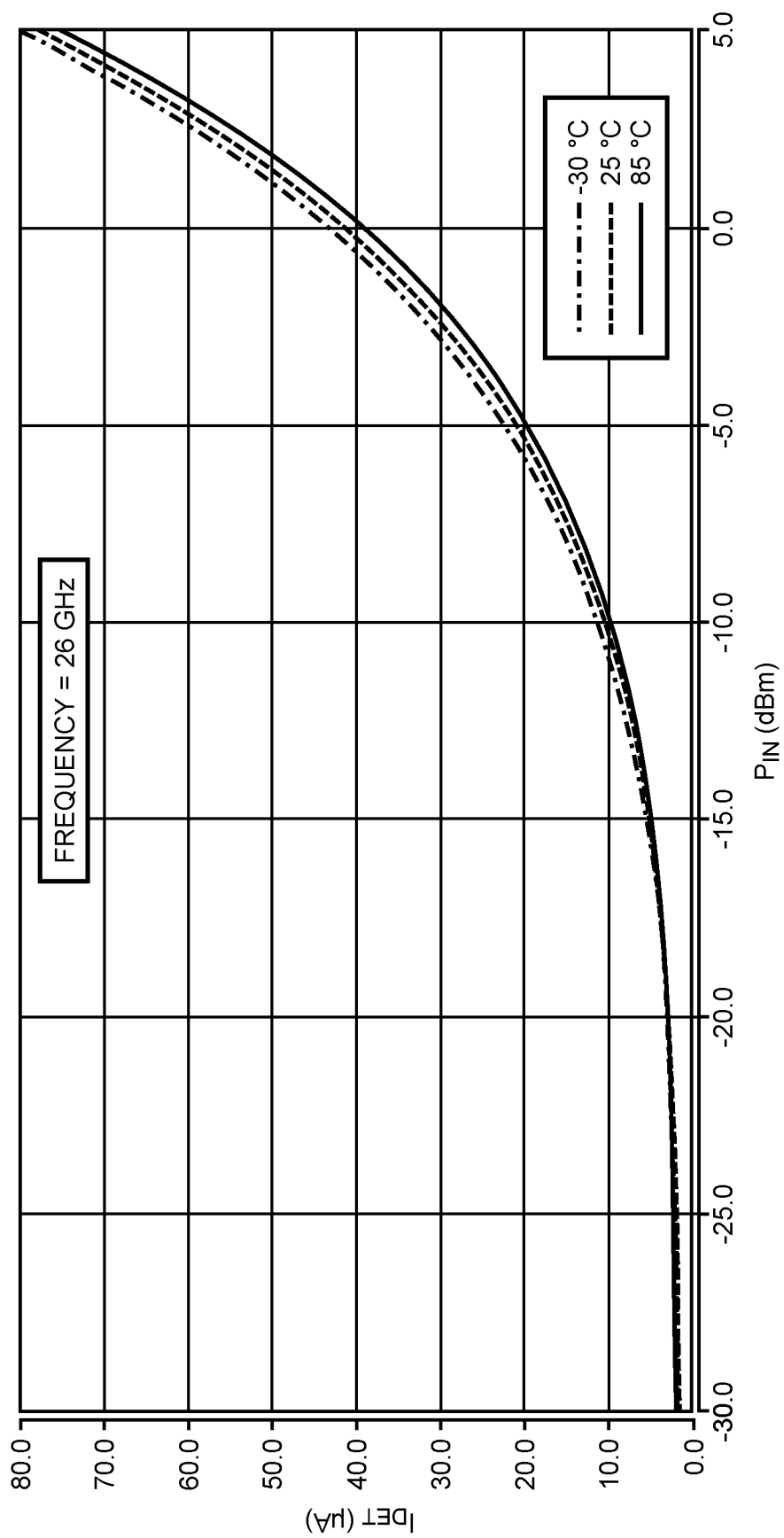
FIG. 2 is a graph showing a simulated detector current versus input power and temperature on a linear scale for operation associated with the first embodiment.

FIG. 2 is a graph depicting results of a simulation of the output current versus input power. The simulation results are associated with the RF power detector 10 generating the detector current $I_{DET1}$ while processing a 26 GHz transmitter signal at temperatures of −30° C., 25° C., and 85° C.

Figure 3:
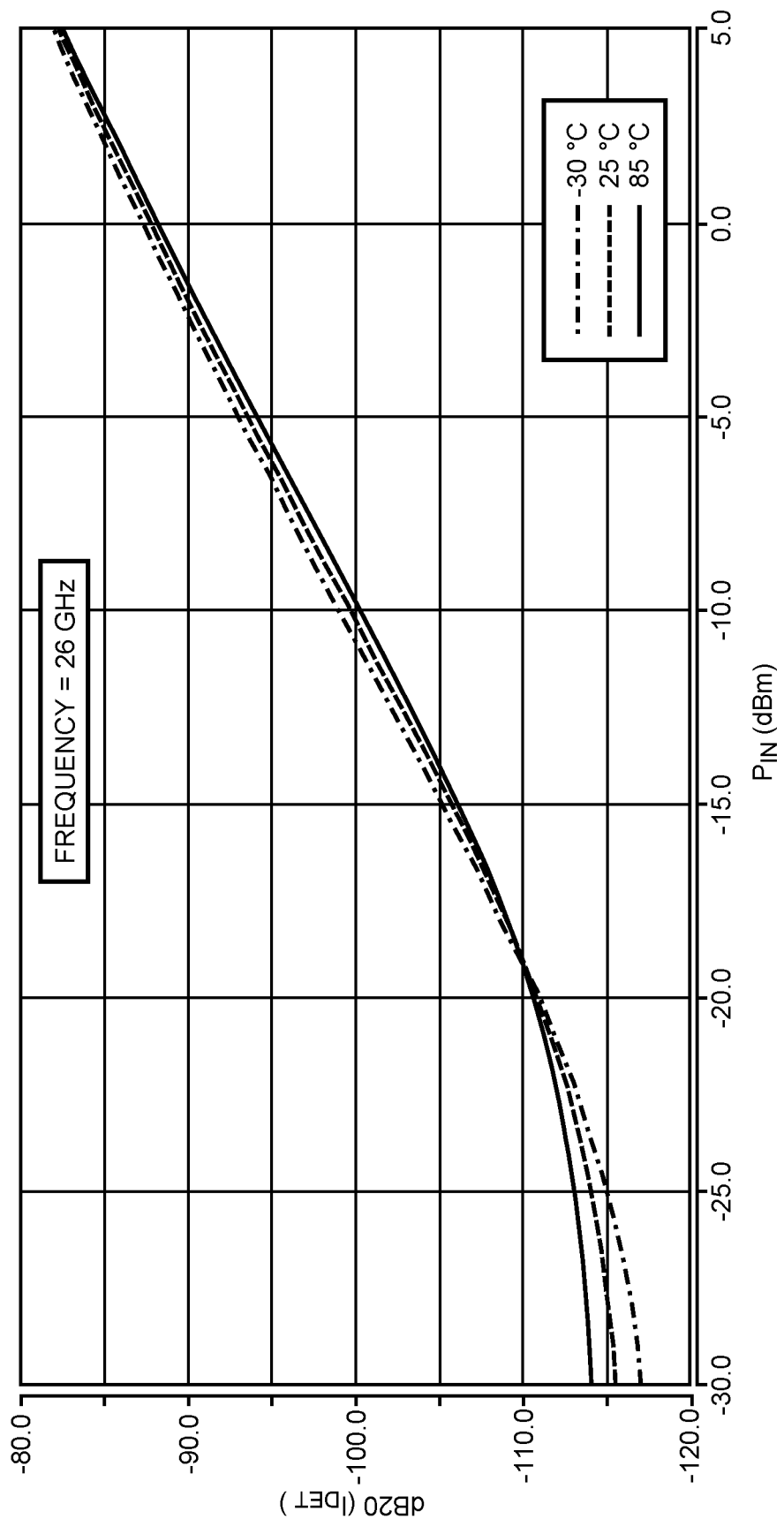
FIG. 3 is a graph showing simulated detector current versus input power and temperature on a logarithmic scale for operation associated with the first embodiment.

FIG. 3 is a graph showing simulated detector current versus input power and temperature on a logarithmic scale for operation associated with the first embodiment. The overall dynamic range of the RF power detector 10 is best visualized on a y-axis log scale which is plotted in FIG. 3. This plot shows that the RF power detector performs robustly over a 20 dB to 25 dB dynamic range, which is more than adequate for typical applications.

Figure 4:
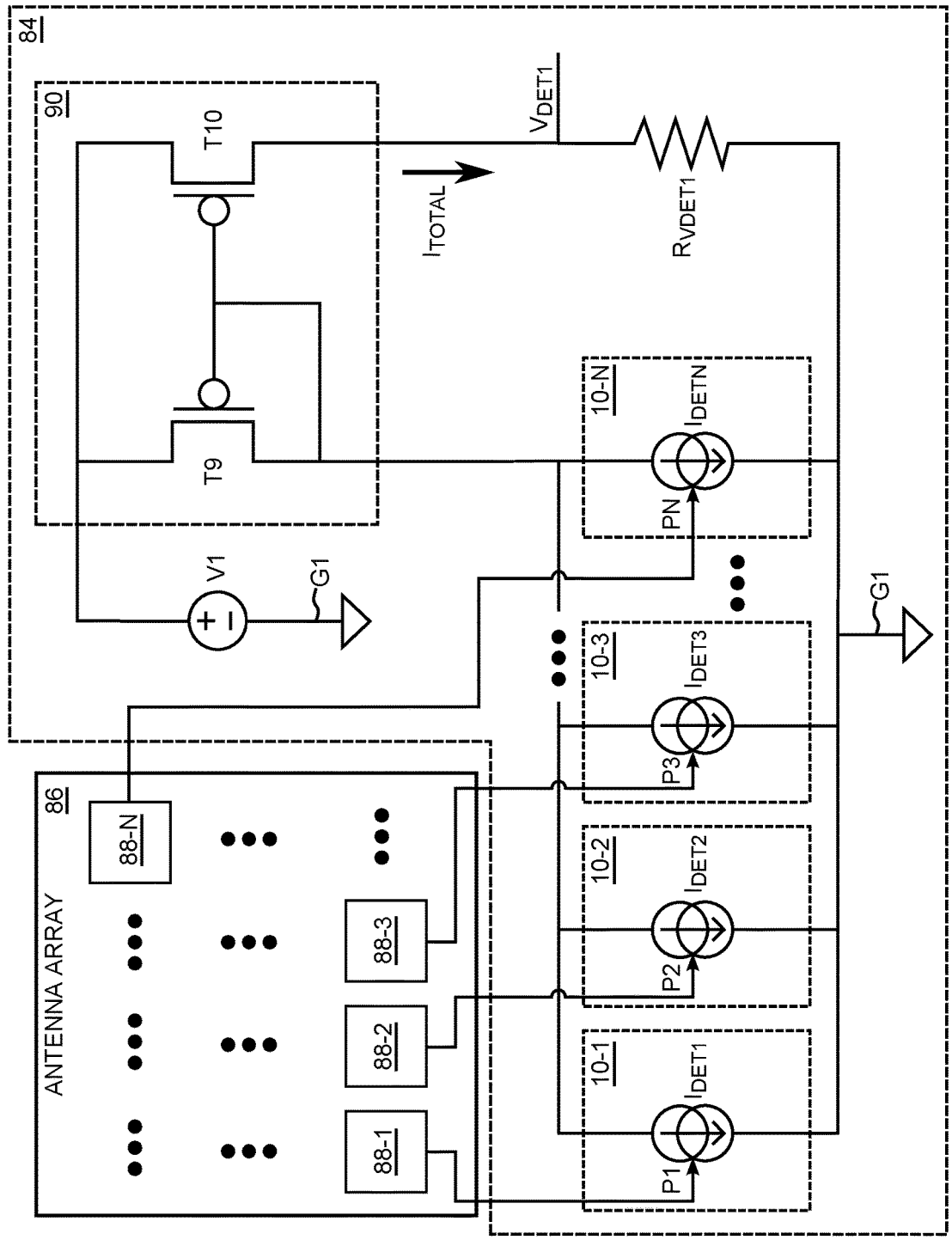
FIG. 4 is a schematic of an RF power detector combiner that is structured in accordance with the present disclosure to measure RF power from an antenna array.

FIG. 4 is a schematic of an embodiment of an RF power detector combiner 84 that is configured to sum a plurality of detector currents $I_{DET1}$, $I_{DET2}$, $I_{DET3}$, and $I_{DETN}$ from a plurality of RF power detectors 10-1, 10-2, 10-3 through 10-N, respectively, wherein N is a natural counting number. In this exemplary embodiment, each of the RF power detectors 10-1 through 10-N is structured identical to the RF power detector 10 depicted in FIG. 1. A total detector current $I_{TOTAL}$ resulting from the summation of the plurality of detector currents $I_{DET1}$, $I_{DET2}$, $I_{DET3}$, and $I_{DETN}$ represents a total output power of an antenna array 86. The antenna array 86 has antenna elements 88-1, 88-2, 88-3 through 88-N. A sample portion of an RF signal transmitted from the antenna element 88-1 is routed to a port P1 of the first RF power detector 10-1. Similarly, a sample portion of an RF signal transmitted from the antenna element 88-2 is routed to a port P2 of the second RF power detector 10-2. Likewise, a sample portion of an RF signal transmitted from the antenna element 88-3 is routed to a port P3 of the third RF power detector 10-3 and a sample portion of an RF signal transmitted from the antenna element 88-N is routed to an Nth port PN of the Nth RF power detector 10-N. In this exemplary embodiment, the RF power detector combiner 84 further includes a combiner current mirror 90 constructed of a first mirror transistor T9 that is coupled between the supply voltage source V1 and the Nth RF power detector 10-N, and a second mirror transistor T10 coupled between the supply voltage source V1 and a detector resistor $R_{VDET1}$. The first mirror transistor T9 and the second mirror transistor T10 are of the PMOS type.

As an example, a first detector current $I_{DET1}$ flowing from the output branch 22 (FIG. 1) may be combined with the detector currents $I_{DET2}$, $I_{DET3}$, and $I_{DETN}$ of other RF power detectors 10-2 through 10-N that are employed to represent the total RF power transmitted from the antenna array 86. The total detector current $I_{TOTAL}$ flows through the detector resistor $R_{VDET1}$ to create a detector voltage VDET1 that can be sampled by an analog-to-digital converter that may be included in external circuitry (not shown). If the detector resistor $R_{VDET1}$ is on the same die as the RF power detectors 10-1 through 10-N, it is desirable to use a similar structure and orientation as the first resistor R1, the third resistor R3, and the fifth resistor R5 that are depicted in FIG. 1. Moreover, it is also desirable to use a similar resistor structure and orientation as the first resistor R1 if a resistor is employed to generate reference current, $I_{REF}$. Alternatively, if the detector resistor $R_{VDET1}$ and the analog-to-digital converter are on a different die than the RF power detectors 10-1 through 10-N, it is a relatively uncomplicated process to calibrate out resistor process variations of each die. This can be done as follows:

Enable a first calibration current $I_{cal1}$ on the detector die;
measure a supply current shift $I_{meas1}$ on the detector die;
enable a second calibration current $I_{cal2}$ on the other die;
measure a supply current shift $I_{meas2}$ on the other die; and
fabricate a resistive digital-to-analog network into detector resistor $R_{VDET1}$ with a nominal setting of $Rvdet_{nom}$.

The detector resistor $R_{VDET1}$ can be determined with the following equation:

$$R_{VDET1} = Rvdet_{nom} * \left(\frac{I_{cal1} * I_{meas2}}{I_{meas1} * I_{cal2}}\right)$$

The resistors used to generate first and second calibration currents load and $I_{cal2}$ must be similar to the ones used in the RF power detectors 10-1 through 10-N and the detector resistor $R_{VDET1}$, respectively. Note that having the detector resistor $R_{VDET1}$ on a different die does require the additional overhead of this calibration but using a current interface to the other die has advantages over a voltage interface. A substantial advantage is that a current interface typically is more immune to noise than a voltage interface. A buffer can be added to a voltage interface to make a voltage interface more immune to noise, but a buffer may lower the bandwidth and add additional DC offset or distortion.

Yet other desirable features may be added to the architecture of the RF power detector 10 due to operation in the current domain. For example, each of the RF power detectors 10-1 through 10-N (FIG. 4 and FIG. 7) may be individually measured if all the other ones of the RF power detectors 10-1 through 10-N are turned off. Additionally, dynamic range requirements of an analog-to-digital converter would be eased if current to be converted to a digital value is multiplied by the total number of RF power detectors 10-1 through 10-N.

Figure 5:
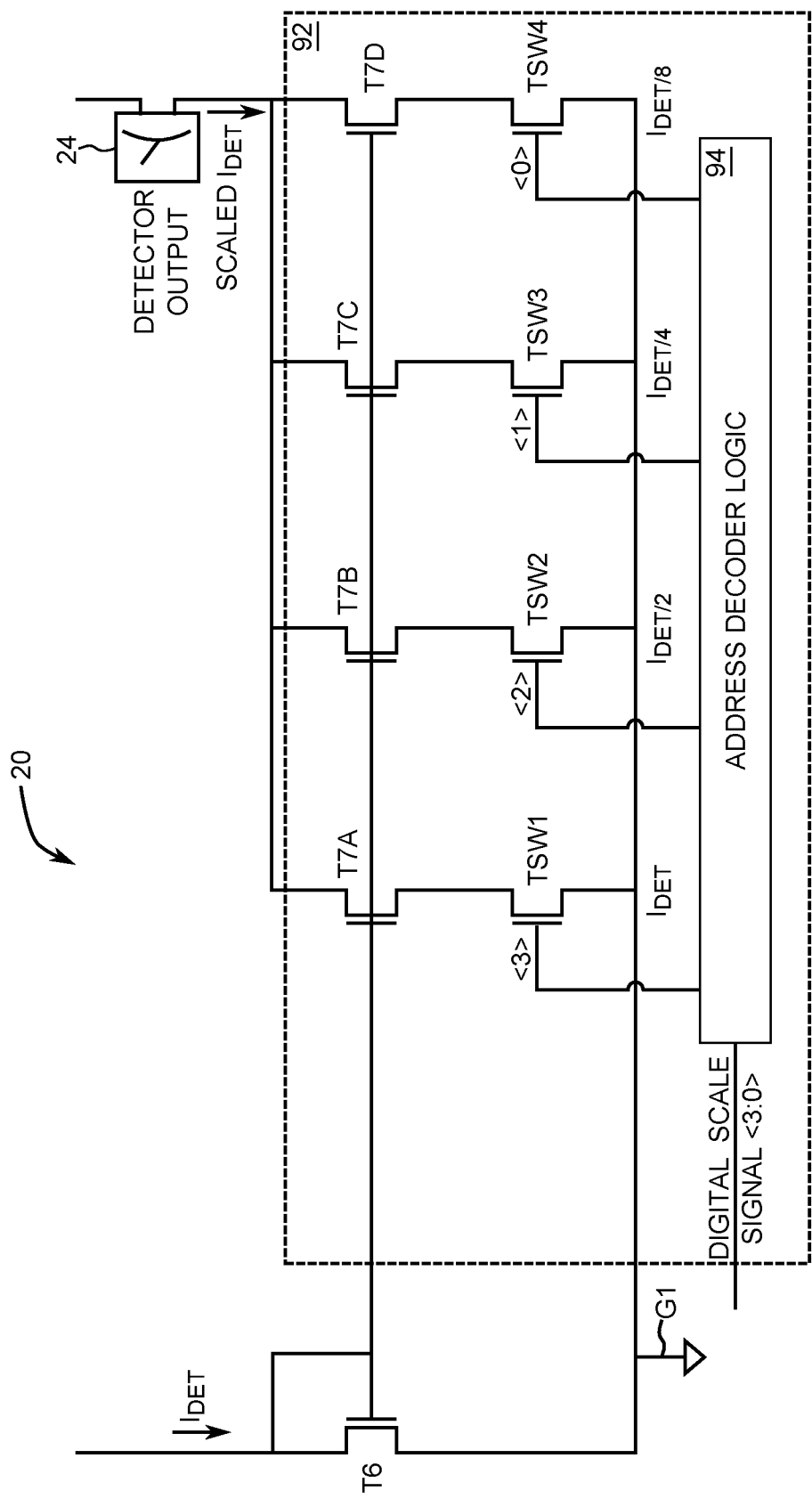
FIG. 5 is a schematic of a detector current scaler that is structured in accordance with the present disclosure.

In this regard, FIG. 5 is a schematic of a detector current scaler 92 that is built into the second current mirror 20 to ease dynamic range requirements. In particular, the detector current scaler 92 is configured to provide digital selection of a mirror ratio of the second current mirror 20. In this exemplary embodiment, the seventh transistor T7 depicted in FIG. 1 is replaced with a plurality of scaling transistors T7A, T7B, T7C, and T7D. The first scaling transistor T7A is coupled in series with a first switch transistor TSW1 between the detector output 24 and ground G1. The first scaling transistor T7A is scaled to allow the full-scale detector current $I_{DET}$ to flow through the detector output 24. The second scaling transistor T7B is coupled in series with a second switch transistor TSW2 between the detector output 24 and ground G1. The second scaling transistor T7B is scaled to allow the one-half the detector current $I_{DET}$ to flow through the detector output 24. The third scaling transistor T7C is coupled in series with a third switch transistor TSW3 between the detector output 24 and ground G1. The third scaling transistor T7C is scaled to allow the one-fourth of the detector current $I_{DET}$ to flow through the detector output 24. The fourth scaling transistor T7D is coupled in series with a fourth switch transistor TSW4 between the detector output 24 and ground G1. The fourth scaling transistor T7D is scaled to allow the one-eighth of the detector current $I_{DET}$ to flow through the detector output 24. The detector current scaler 92 may further include address decoder logic 94 that is configured to receive and decode a digital scale signal to provide switching logic levels <3>, <2>, <1>, and <0> for the switch transistors TSW1 through TSW4, respectively.

In an example associated with FIG. 5, it is assumed that there are eight transmitter lineups (not shown) driving eight antenna elements 88-1 through 88-8. When measuring a single RF power detector, such as RF power detector 10-1, the first transistor TSW1 is enabled. When measuring all eight RF power detectors 10-1 through 10-8, the fourth switch transistor TSW4 is enabled. This also allows any number of the RF power detectors 10-1 through 10-8 to be enabled. Further still, the detector current scaler 92 may also be used to boost the detector current when the total power is very low, which further reduces the dynamic range requirement of the analog-to-digital converter. Having the detected signal in the current domain allows tremendous flexibility when multiple transmitter lineups are needed, which is the case with millimeter wave phased array antennas.

Figure 6:
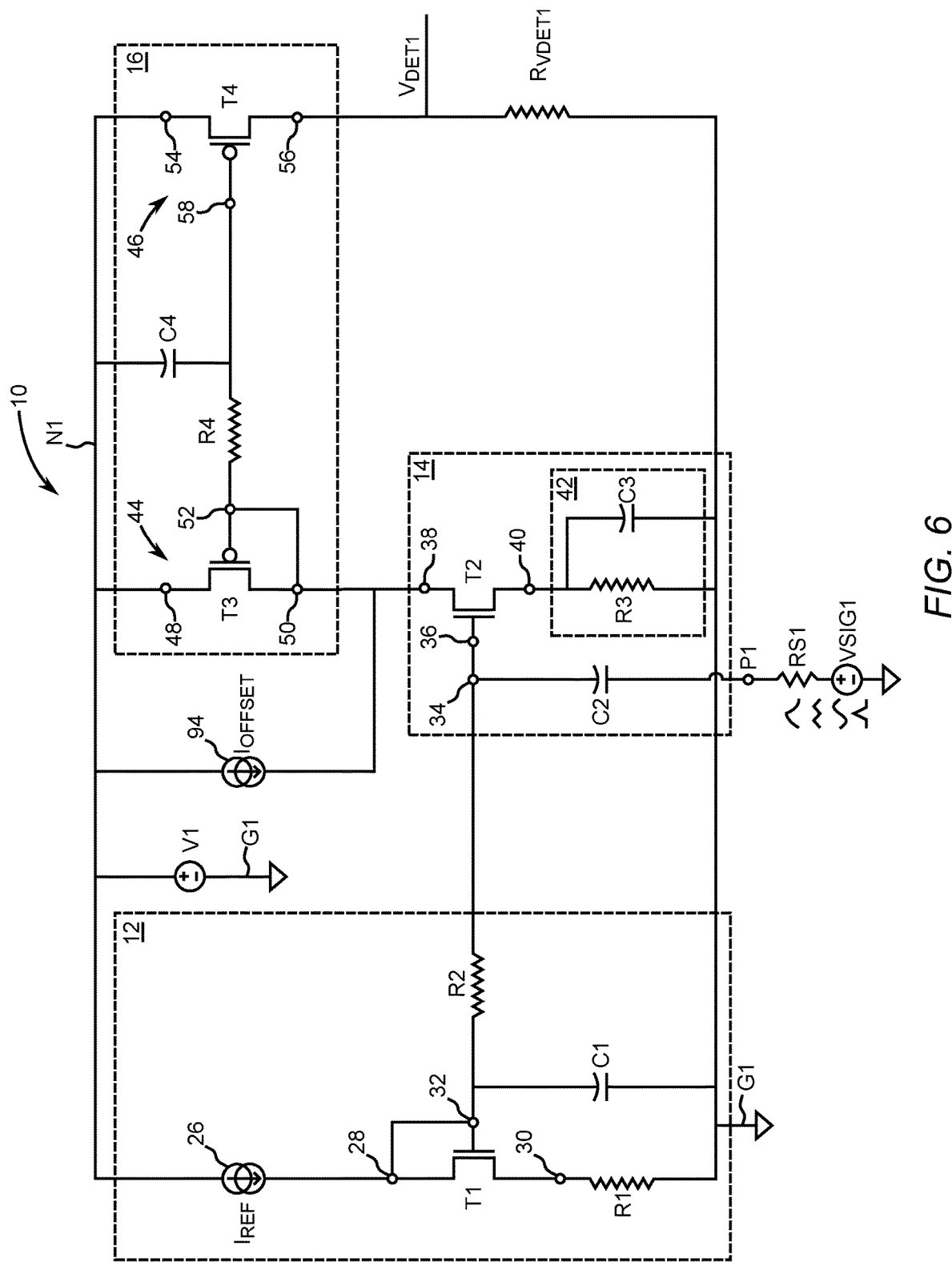
FIG. 6 is a schematic of an alternative embodiment of the RF power detector of FIG. 1.

An alternate embodiment of the RF power detector 10 is depicted in the schematic of FIG. 6. If the offset current is injected into the drain of T2, the second current mirror 20 (FIG. 1) may be eliminated. The alternative embodiment of the RF power detector 10 depicted in FIG. 6 performs practically identically to the RF power detector 10 depicted in FIG. 1 and may have slightly less device mismatch error than that of the embodiment of FIG. 1. An alternate current combiner and scaler are employed to support this embodiment.

Figure 7:
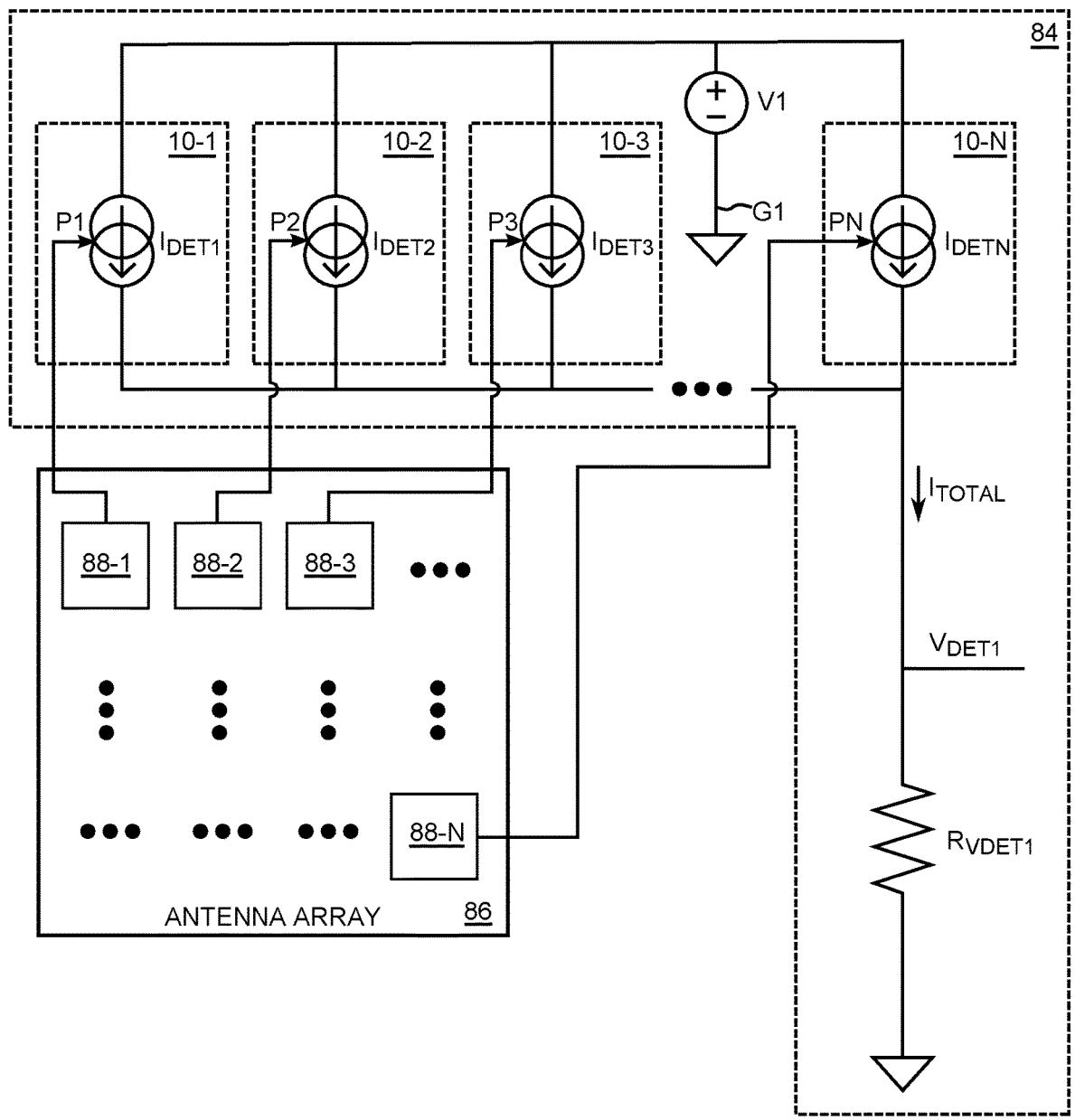
FIG. 7 is a schematic of an alternative embodiment of the RF power detector combiner of FIG. 4.

In this regard, FIG. 7 is a schematic of an alternative embodiment of the RF power detector combiner 84 that is structured in accordance with the present disclosure. In this alternate embodiment, the combiner current mirror 90 depicted in FIG. 4 is not employed, thus having an advantage of reduced real estate. The interaction between the RF power detector combiner 84 and the antenna array 86 remains the same as with the embodiment depicted in FIG. 4.

Figure 8:
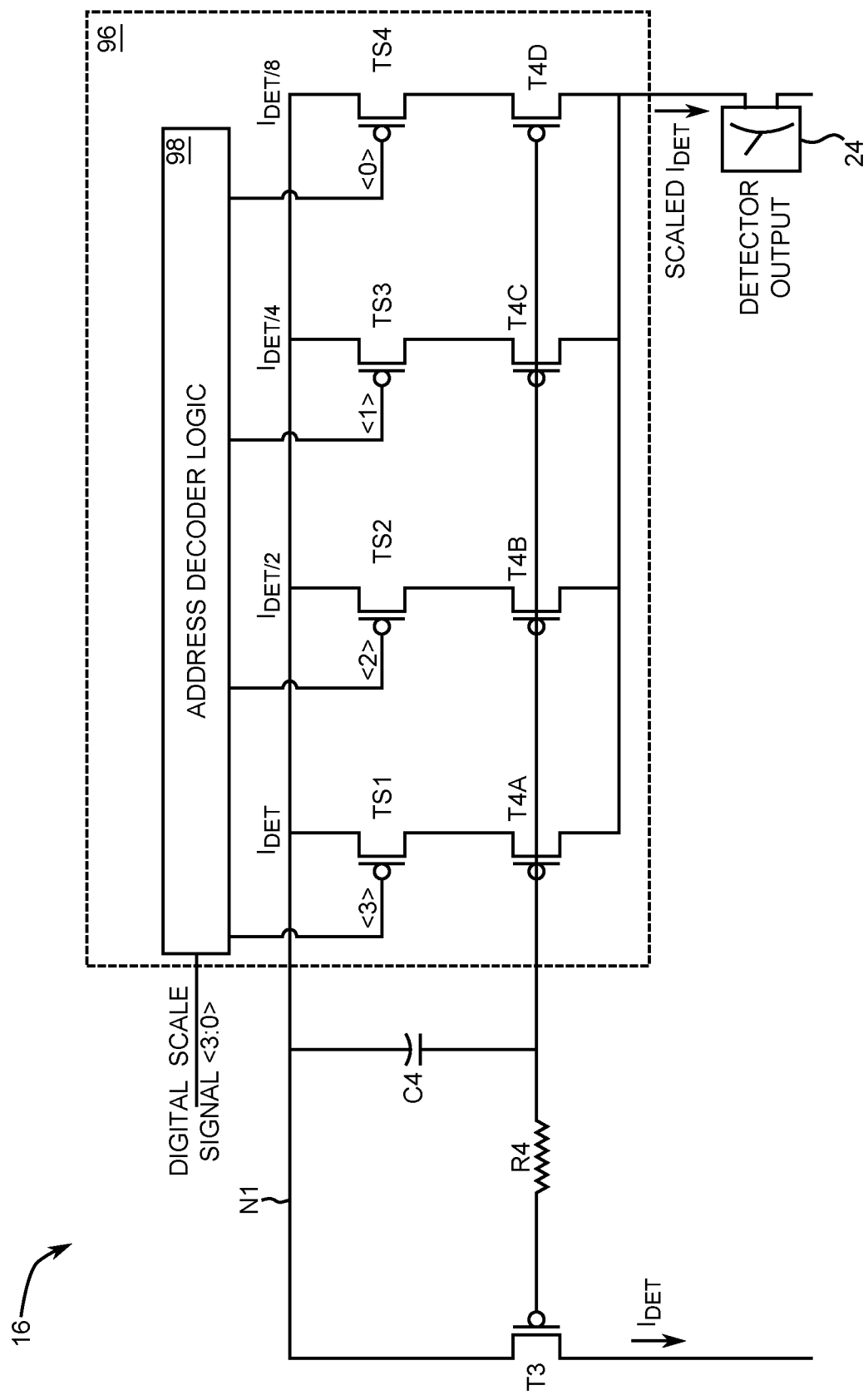
FIG. 8 is a schematic of an alternative embodiment of the detector current scaler of FIG. 5.

FIG. 8 is a schematic of a detector current scaler 96 that is built into the detector current mirror 16 to ease dynamic range requirements. In this exemplary embodiment, the fourth transistor T4 depicted in FIG. 1 and FIG. 6 is replaced with a plurality of scaling transistors T4A, T4B, T4C, and T4D, wherein the plurality of scaling transistors is configured to scale the detector current with a binary scale. The first scaling transistor T4A is coupled in series with a first switch transistor TS1 between the supply node N1 and the detector output 24. The first scaling transistor T4A is scaled to allow the full-scale detector current $I_{DET}$ to flow through the detector output 24. The second scaling transistor T4B is coupled in series with a second switch transistor TS2 between the supply node N1 and the detector output 24. The second scaling transistor T4B is scaled to allow one-half the detector current $I_{DET}$ to flow through the detector output 24. The third scaling transistor T4C is coupled in series with a third switch transistor TS3 between the supply node N1 and the detector output 24. The third scaling transistor T4C is scaled to allow one-fourth of the detector current $I_{DET}$ to flow through the detector output 24. The fourth scaling transistor T4D is coupled in series with a fourth switch transistor TS4 between the supply node N1 and the detector output 24. The fourth scaling transistor T4D is scaled to allow one-eighth of the detector current $I_{DET}$ to flow through the detector output 24. The detector current scaler 96 may further include address decoder logic 98 that is configured to receive and decode a digital scale signal to provide switching logic levels <3>, <2>, <1>, and <0> for the switch transistors TS1 through TS4, respectively.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A radio frequency (RF) power detector configured to detect power fed to a corresponding one of a plurality of millimeter wave antennas that are arranged into an antenna array, and couple in parallel with a plurality other RF power detectors that detect power fed to other individual ones of the plurality of millimeter wave antennas, the RF power detector comprising:
   an envelope detector having an RF signal terminal that is configured to couple with the corresponding one of the plurality of millimeter wave antennas and a current mode terminal, wherein the envelope detector is configured to detect peak voltages of an RF signal at the RF signal terminal;
   a current mirror having a first branch coupled to the current mode terminal and a second branch configured to create a detector current that is proportional to a branch current through the first branch in response to peak voltages detected by the envelope detector;
   an offset current subtraction branch configured to subtract an offset current from the detector current to generate a corrected detector current, wherein the offset current subtraction branch has a fixed resistor through which the offset current flows and a control terminal coupled to the RF signal terminal; and
   a current terminal configured to couple to a detector resistor through which the corrected detector current flows along with corrected detector currents from the plurality of other RF power detectors.

2. The RF power detector of claim 1 wherein the envelope detector comprises:
   a first transistor having a control terminal coupled to the RF signal terminal, a first current terminal coupled to the current mode terminal and a second current terminal; and
   a low-pass filter coupled between the second current terminal and a fixed voltage node, wherein the low-pass filter is configured to shunt RF components from the peak voltages to the fixed voltage node.

3. The RF power detector of claim 1 wherein the first branch of the current mirror comprises a first mirror transistor having a first current terminal coupled to a supply node and a second current terminal coupled to the current mode terminal and a first control terminal coupled to the second current terminal.

4. The RF power detector of claim 3 wherein the second branch of the current mirror comprises a second mirror transistor having a third current terminal coupled to the supply node and a fourth current terminal coupled to a detector output and a second control terminal coupled to the first control terminal of the first mirror transistor.

5. The RF power detector of claim 4 wherein the second control terminal is coupled to the first control terminal of the first mirror transistor through a resistor configured to filter the detector current.

6. The RF power detector of claim 5 further including a filter capacitor coupled between the second control terminal and the second mirror transistor.

7. The RF power detector of claim 3 further comprising a plurality of scaling transistors each of which is coupled in series with a corresponding one of a plurality of switch transistors between the supply node and a detector output, wherein each of the plurality of switch transistors is configured to be selectively turned on and off.

8. The RF power detector of claim 7 wherein each of the plurality of scaling transistors has a control terminal that is coupled to the first control terminal of the first mirror transistor.

9. The RF power detector of claim 7 wherein the plurality of scaling transistors is configured to scale the detector current with a binary scale.

10. An RF power detector combiner comprising:
    a plurality of RF power detectors, wherein each of the plurality of RF power detectors is configured to detect power fed to a corresponding one of a plurality of millimeter wave antennas that are arranged into an antenna array and, wherein each of the plurality of RF power detectors comprises:
       an envelope detector having an RF signal terminal that is configured to couple with the corresponding one of the plurality of millimeter wave antennas and a current mode terminal, wherein the envelope detector is configured to detect peak voltages of an RF signal at the RF signal terminal;
       a current mirror having a first branch coupled to the current mode terminal and a second branch configured to create a detector current that is proportional to a branch current through the first branch in response to peak voltages detected by the envelope detector; and
       an offset current subtraction branch configured to subtract an offset current from the detector current, wherein the offset current subtraction branch has a fixed resistor through which the offset current flows and a control terminal coupled to the RF signal terminal; and
    a detector resistor coupled in series with the plurality of RF power detectors, wherein the detector resistor is configured to generate a detector voltage from a total detector current flowing from the plurality of RF power detectors.

11. The RF power detector combiner circuitry of claim 10 wherein the envelope detector comprises:
    a first transistor having a control terminal coupled to the RF signal terminal, a first current terminal coupled to the current mode terminal and a second current terminal; and
    a low-pass filter coupled between the second current terminal and a fixed voltage node, wherein the low-pass filter is configured to shunt RF components from the peak voltages to the fixed voltage node.

12. The RF power detector combiner circuitry of claim 10 wherein the first branch of the current mirror comprises a first mirror transistor having a first current terminal coupled to a supply node and a second current terminal coupled to the current mode terminal and a first control terminal coupled to the second current terminal.

13. The RF power detector combiner circuitry of claim 12 wherein the second branch of the current mirror comprises a second mirror transistor having a third current terminal coupled to the supply node and a fourth current terminal coupled to a detector output and a second control terminal coupled to the first control terminal of the first mirror transistor.

14. The RF power detector combiner circuitry of claim 13 wherein the second control terminal is coupled to the first control terminal of the first mirror transistor through a resistor configured to filter the detector current.

15. The RF power detector combiner circuitry of claim 14 further including a filter capacitor coupled between the second control terminal of the second mirror transistor.

16. The RF power detector combiner circuitry of claim 12 further comprising a plurality of scaling transistors each of which is coupled in series with a corresponding one of a plurality of switch transistors between a supply node and a detector output, wherein each of the plurality of switch transistors is configured to be selectively turned on and off.

17. The RF power detector combiner circuitry of claim 16 wherein each of the plurality of scaling transistors has a control terminal that is coupled to the first control terminal of the first mirror transistor.

18. The RF power detector combiner circuitry of claim 16 wherein the plurality of scaling transistors is configured to scale the detector current with a binary scale.

\* \* \* \* \*

UNITED STATES PATENT AND TRADEMARK OFFICE
CERTIFICATE OF CORRECTION

| | |
|---|---|
| PATENT NO. | : 11,757,541 B2 |
| APPLICATION NO. | : 17/161137 |
| DATED | : September 12, 2023 |
| INVENTOR(S) | : Jeffery Peter Ortiz |

It is certified that error appears in the above-identified patent and that said Letters Patent is hereby corrected as shown below:

In the Specification

In Column 7, Line 9, replace "currents load" with --currents $I_{cal1}$--.

Signed and Sealed this
Tenth Day of October, 2023

Katherine Kelly Vidal
*Director of the United States Patent and Trademark Office*